(12) United States Patent
Siebler

(10) Patent No.: US 10,038,439 B2
(45) Date of Patent: Jul. 31, 2018

(54) CONTROL CIRCUIT AND CONTROL METHOD FOR TURNING ON A POWER SEMICONDUCTOR SWITCH

(71) Applicant: Power Integrations Switzerland GmbH, Biel-Bienne (CH)

(72) Inventor: Matthias Johannes Siebler, Walenstadtberg (CH)

(73) Assignee: Power Integrations Switzerland GmbH, Biel-Bienne (CH)

( * ) Notice: Subject to any disclaimer, the term of this patent is extended or adjusted under 35 U.S.C. 154(b) by 0 days.

(21) Appl. No.: 15/698,292

(22) Filed: Sep. 7, 2017

(65) Prior Publication Data

US 2017/0373683 A1    Dec. 28, 2017

Related U.S. Application Data

(63) Continuation of application No. 15/017,331, filed on Feb. 5, 2016, now Pat. No. 9,787,300.

(30) Foreign Application Priority Data

Feb. 16, 2015 (EP) .................................... 15155262

(51) Int. Cl.
*H03B 1/00* (2006.01)
*H03K 3/00* (2006.01)
(Continued)

(52) U.S. Cl.
CPC ........ *H03K 17/567* (2013.01); *H03K 17/0412* (2013.01); *H03K 17/163* (2013.01); *H03K 17/166* (2013.01)

(58) Field of Classification Search
CPC .......... H03K 17/567; H03L 7/097; H02P 6/14
(Continued)

(56) References Cited

U.S. PATENT DOCUMENTS

2007/0103133 A1* 5/2007 Joos ..................... H03K 17/166
                                                        323/282
2009/0027096 A1   1/2009 Mourrier et al.

FOREIGN PATENT DOCUMENTS

EP    1906532 A1    4/2008
EP    2587670 A1    5/2013
GB    2 417 149 A   2/2006

OTHER PUBLICATIONS

European Patent Application No. 15155262.7—Extended European Search Report, dated Nov. 26, 2015, with English Translation (24 pages).

(Continued)

*Primary Examiner* — Thomas Skibinski
(74) *Attorney, Agent, or Firm* — Christensen O'Connor Johnson Kindness PLLC

(57) ABSTRACT

A control circuit for turning on a power semiconductor switch includes an input that receives a signal characterizing a switch-on behavior of the power semiconductor switch. A phase detection circuit detects two or more phases of the switch-on behavior of the power semiconductor switch in response to the signal that characterizes the switch-on behavior of the power semiconductor switch. The phase detection circuit is coupled to generate a phase signal that indicates which of the two or more phases the power semiconductor switch is currently running through. A variable current source is coupled to supply a current with a variable level to a control input of the power semiconductor switch to switch on the power semiconductor switch. The control circuit is coupled to control the variable current source in a closed control loop in response to the signal that characterizes the switch-on behavior of the power semiconductor switch.

28 Claims, 4 Drawing Sheets

(51) Int. Cl.
    *H03K 17/567*     (2006.01)
    *H03K 17/0412*     (2006.01)
    *H03K 17/16*     (2006.01)

(58) Field of Classification Search
    USPC ........ 327/108–112, 427, 434, 437, 141–143, 327/155, 156, 162, 163, 170; 326/82, 83, 326/87; 323/282–285
    See application file for complete search history.

(56) References Cited

OTHER PUBLICATIONS

EPO Communication pursuant to Article 94(3) with English Translation dated Feb. 22, 2018, for European Application No. 15155262.7, filed Feb. 16, 2015, 16 pages.

* cited by examiner

CONTROL CIRCUIT AND CONTROL METHOD FOR TURNING ON A POWER SEMICONDUCTOR SWITCH

CROSS-REFERENCE TO RELATED APPLICATIONS

This application is a continuation of U.S. patent application Ser. No. 15/017,331, filed on Feb. 5, 2016, now pending, which claims priority to European Patent (EP) Application No. 15155262.7, filed Feb. 16, 2015. U.S. patent application Ser. No. 15/017,331, and EP Application No. 15155262.7 are hereby incorporated by reference.

BACKGROUND INFORMATION

In order to improve the switching behavior of power semiconductor switches (such as IGBTs for example), control circuits in the prior art use external resistors. The latter are coupled to the control terminal of the power semiconductor switch during a switch-on process, such that a switch-on current can flow into the control input in order to switch on the power semiconductor switch. In some examples, the external resistors can have a resistance of 8Ω or more, which can generate certain losses in specific situations.

SUMMARY OF THE INVENTION

In a first general aspect, a control circuit for turning on a power semiconductor switch comprises an input which is configured to receive a signal that characterizes the switch-on behavior of the power semiconductor switch, a variable current source which is configured to supply a current with a variable level to a control input of the power semiconductor switch in order to switch on the power semiconductor switch, wherein the control circuit is configured to control the variable current source in a closed control loop in response to the signal that characterizes the switch-on behavior of the power semiconductor switch.

In a second aspect in accordance with the first aspect, the control circuit further comprises a phase detection circuit which is configured to detect two or more phases in the course of the switch-on process of the power semiconductor switch based on the signal that characterizes a switch-on behavior of the power semiconductor switch, and to generate a phase signal, which indicates which of the two or more phases the power semiconductor switch is currently running through, wherein the variable current source is configured to supply the current with variable current strength to a control input of the power semiconductor switch in response to the phase signal in order to switch on the power semiconductor switch.

In a third general aspect, a control circuit for turning on a power semiconductor switch comprises an input which is configured to receive a signal that characterizes the switch-on behavior of the power semiconductor switch, a phase detection circuit which is configured to detect two or more phases in the course of the switch-on process of the power semiconductor switch based on the signal that characterizes a switch-on behavior of the power semiconductor switch, and to generate a phase signal, which indicates which of the two or more phases the power semiconductor switch is currently running through, and a variable current source which is configured to supply a current with variable current strength to a control input of the power semiconductor switch in response to the phase signal in order to switch on the power semiconductor switch.

The use of a variable current source enables the control circuit to have a variable transconductance. That can be helpful in order to optimize various parameters of the circuit (for example in order to reduce losses during the switch-on process). The same applies to the control of the variable current source in a closed control loop. Furthermore, in some examples, a variable current source can have a higher stability with respect to production-dictated fluctuations and temperature fluctuations than a circuit having external resistors. The detection of phases on the basis of a signal that characterizes the switch-on behavior of the power semiconductor switch can be carried out with relatively low circuitry outlay (particularly if a control input voltage is used). That can reduce the complexity and thus the price of the control circuit. Furthermore, in some examples, the control circuits comprising a phase detection circuit can be adapted to different power semiconductor switches in a relatively simple manner. Moreover, in some examples in the case of power semiconductor switches having medium or high gate charge the response time can be shortened.

In a fourth aspect in accordance with the second or third aspect, the signal that characterizes a switch-on behavior of the power semiconductor switch is a control input voltage which is present at the control input of the power semiconductor switch.

In a fifth aspect in accordance with the fourth aspect, the control input voltage is a base-emitter voltage or a gate-source voltage.

In a sixth aspect in accordance with any of the second to fifth aspects, the phase detection circuit identifies the two or more phases in the course of a switch-on process on the basis of characteristic features of the signal that characterizes a switch-on behavior of the power semiconductor switch.

In a seventh aspect in accordance with any of the second to sixth aspects, the phase detection circuit contains one or a plurality of comparators, wherein each of the one or the plurality of comparators is configured to compare the signal that characterizes a switch-on behavior of the power semiconductor switch with one of one or more reference signals.

In an eighth aspect in accordance with the seventh aspect, the phase detection circuit detects transitions between one or a plurality of the phases in the course of a switch-on process of the power semiconductor switch if the signal that characterizes a switch-on behavior of the power semiconductor switch exceeds a respective reference signal.

In a ninth aspect in accordance with any of the second to eighth aspects, the phase detection circuit comprises a peak timing detection circuit which is configured to identify a point in time of a peak in the signal that characterizes a switch-on behavior of the power semiconductor switch.

In a tenth aspect in accordance with the ninth aspect, the phase detection circuit is configured to detect a transition between a first and a second phase if the signal that characterizes the switch-on behavior of the power semiconductor switch reaches the peak.

In an eleventh aspect in accordance with any of the second to tenth aspects, the phase detection circuit is configured to detect at least four phases in the course of the switch-on process of the power semiconductor switch.

In a twelfth aspect in accordance with the eleventh aspect, a first phase begins if a switch-on signal of a control circuit of the power semiconductor switch indicates that the power semiconductor switch is intended to be switched on, and wherein the first phase ends if the signal that characterizes the switch-on behavior of the power semiconductor switch exceeds a first threshold value.

In a thirteenth aspect in accordance with the twelfth aspect, a second phase begins if the signal that characterizes the switch-on behavior of the power semiconductor switch exceeds the first threshold value, and wherein the second phase ends if the signal that characterizes the switch-on behavior of the power semiconductor switch reaches a peak.

In a fourteenth aspect in accordance with the thirteenth aspect, a third phase begins if the signal that characterizes the switch-on behavior of the power semiconductor switch reaches the peak and wherein the third phase ends if the signal that characterizes the switch-on behavior of the power semiconductor switch exceeds a second threshold value, wherein the second threshold value is higher than the first threshold value.

In a fifteenth aspect in accordance with the fourteenth aspect, a fourth phase begins if the signal that characterizes the switch-on behavior of the power semiconductor switch exceeds the second threshold value.

In a sixteenth aspect in accordance with any of the second to fifteenth aspects, a first phase begins if a switch-on signal of a control circuit of the power semiconductor switch indicates that the power semiconductor switch is intended to be switched on.

In a seventeenth aspect in accordance with any of the second to sixteenth aspects, a second phase begins if the power semiconductor switch begins to conduct.

In an eighteenth aspect in accordance with any of the second to eleventh, sixteenth or seventeenth aspects, a third phase begins if an operating current through the power semiconductor switch reaches a peak.

In a nineteenth aspect in accordance with any of the second to eleventh, sixteenth, seventeenth or eighteenth aspects, a fourth phase begins if the power semiconductor switch enters the active region.

In a twentieth aspect in accordance with any of the second to nineteenth aspects, the variable current source can supply a plurality of discrete levels of current strengths.

In a twenty-first aspect in accordance with any of the second to twentieth aspects, the variable current source comprises a plurality of parallel driver stages.

In a twenty-second aspect in accordance with the twenty-first aspect, each of the plurality of driver stages is configured to supply a predetermined current to the control input of the power semiconductor switch.

In a twenty-third aspect in accordance with the twenty-second aspect, each of the plurality of driver stages is configured to amplify a predetermined input current by a specific factor.

In a twenty-fourth aspect in accordance with the twenty-third aspect, the control circuit comprises a region having a higher voltage level and a region having a lower voltage level, wherein the input current is supplied by a current source in the region having a lower voltage level, and wherein the predetermined input current is fed without additional level shifters into the region having a higher voltage level.

In a twenty-fifth aspect in accordance with any of the twenty-first to twenty-fourth aspects, the control circuit furthermore comprises a selection circuit which is configured to select one or a plurality of driver stages that supply the predetermined input current in response to the phase detection signal.

In a twenty-sixth aspect in accordance with any of the twenty-first to twenty-fifth aspects, the driver stages comprise current mirror circuits.

In a twenty-seventh aspect in accordance with the twenty-sixth aspect, the current mirror circuits in each driver stage comprise cascoded circuits.

In a twenty-eighth aspect in accordance with any of the second to twenty-seventh aspects, the variable current source can generate current with at least four different levels of the input current.

In a twenty-ninth aspect in accordance with the twenty-eighth aspect, the current which is supplied to the control input of the power semiconductor switch has a first level in a first phase in the course of the switch-on process of the power semiconductor switch, a second level in the course of a second phase in the course of the switch-on process of the power semiconductor switch, and a third level in a third phase in the course of the switch-on process of the power semiconductor switch, wherein the third level is lower than the first level and higher than the second level.

In a thirtieth aspect in accordance with the twenty-ninth aspect, the current is reduced in steps from the first to the second level.

In a thirty-first aspect in accordance with the twenty-ninth or thirtieth aspect, the current is set, in a fourth phase, to a predetermined minimum current that just suffices to keep the power semiconductor switch in a switched-on state.

In a thirty-second aspect in accordance with any of the second to thirty-first aspects, the phase detection circuit comprises one or a plurality of level shifters which are configured to convert an internal signal that is output by one or a plurality of comparators from a high voltage level in the control circuit to a low voltage level in the control circuit.

In a thirty-third aspect in accordance with the second or third aspect, the signal that characterizes a switch-on behavior of the power semiconductor switch is a voltage that is present across the power terminals of the power semiconductor switch.

In a thirty-fourth aspect in accordance with the thirty-third aspect, the voltage is a collector-emitter voltage or a drain-source voltage.

In a thirty-fifth aspect in accordance with any of the second to thirty-third aspects, the control circuit comprises a charge pump circuit and a bootstrap circuit.

In a thirty-sixth aspect in accordance with any of the preceding aspects, the power semiconductor switch is an IGBT.

In a thirty-seventh aspect in accordance with any of the preceding aspects, the control circuit identifies a transition between two phases of the switch-on process if the signal that characterizes the switch-on behavior of the power semiconductor switch assumes a maximum.

In a thirty-eighth aspect in accordance with the thirty-seventh aspect, the circuit for detecting the maximum comprises a plurality of delay circuits, the delays of which are adapted to a respective power semiconductor switch.

In a thirty-ninth aspect in accordance with the second or third aspect, the two or more phases in the course of a switch-on process of the power semiconductor switch are detected based on a control input voltage which is present at the control input of the power semiconductor switch, and additionally based on a voltage which is present across the power terminals of the power semiconductor switch.

In a fortieth aspect in accordance with any of the preceding aspects, the control circuit is configured to the effect that a transconductance of the control circuit can be altered in the course of the switch-on process of the power semiconductor switch.

In a forty-first aspect in accordance with any of the preceding aspects, the control circuit is configured such that no external resistors are required for switching on the power semiconductor switch.

In a forty-second aspect, a method for switching on a power semiconductor switch comprises receiving a signal that characterizes the switch-on behavior of the power semiconductor switch, controlling a current to a control input of a power semiconductor switch in a closed control loop based on the signal that characterizes a switch-on behavior of the power semiconductor switch in order to switch on the power semiconductor switch.

In a forty-third aspect in accordance with the forty-second aspect, the method furthermore comprises detecting two or more phases in the signal that characterizes a switch-on behavior of the power semiconductor switch, wherein controlling a current to a control input of a power semiconductor switch comprises varying the current in response to detecting two or more phases in the signal that characterizes a switch-on behavior of the power semiconductor switch.

In a forty-fourth aspect in accordance with any of the third to thirty-ninth aspects and the forty-second aspect, the control circuit is configured to control the variable current source in a closed control loop in response to the signal that characterizes the switch-on behavior of the power semiconductor switch.

BRIEF DESCRIPTION OF THE DRAWINGS

Non-limiting and non-exhaustive exemplary embodiments of the invention are described with reference to the following figures, wherein identical reference signs refer to identical components in the different figures, unless specified otherwise.

DETAILED DESCRIPTION

The following description presents numerous details for enabling a thorough understanding of the present invention. It is clear to the person skilled in the art, however, that the specific details are not necessary to implement the present invention. Elsewhere, known devices and methods are not set out in detail, in order not to unnecessarily hamper understanding of the present invention.

In the present description, a reference to "one embodiment", "one configuration", "one example" or "example" means that a specific feature, a structure or property, which is described in conjunction with this embodiment is included in at least one embodiment of the present invention. In this regard, the phases "in one embodiment", "one example" or "in one example" at different points in this description do not necessarily all relate to the same embodiment or the same example. Furthermore, the specific features, structures or properties can be combined in arbitrary suitable combinations and/or subcombinations in one or more embodiments or examples. Special features, structures or properties can be included in an integrated circuit, in an electronic circuit, in a circuit logic or in other suitable components which provide the described functionality. Furthermore, it is pointed out that the drawings serve the purpose of elucidation for the person skilled in the art and that the drawings are not necessarily drawn true to scale.

Figure 5:
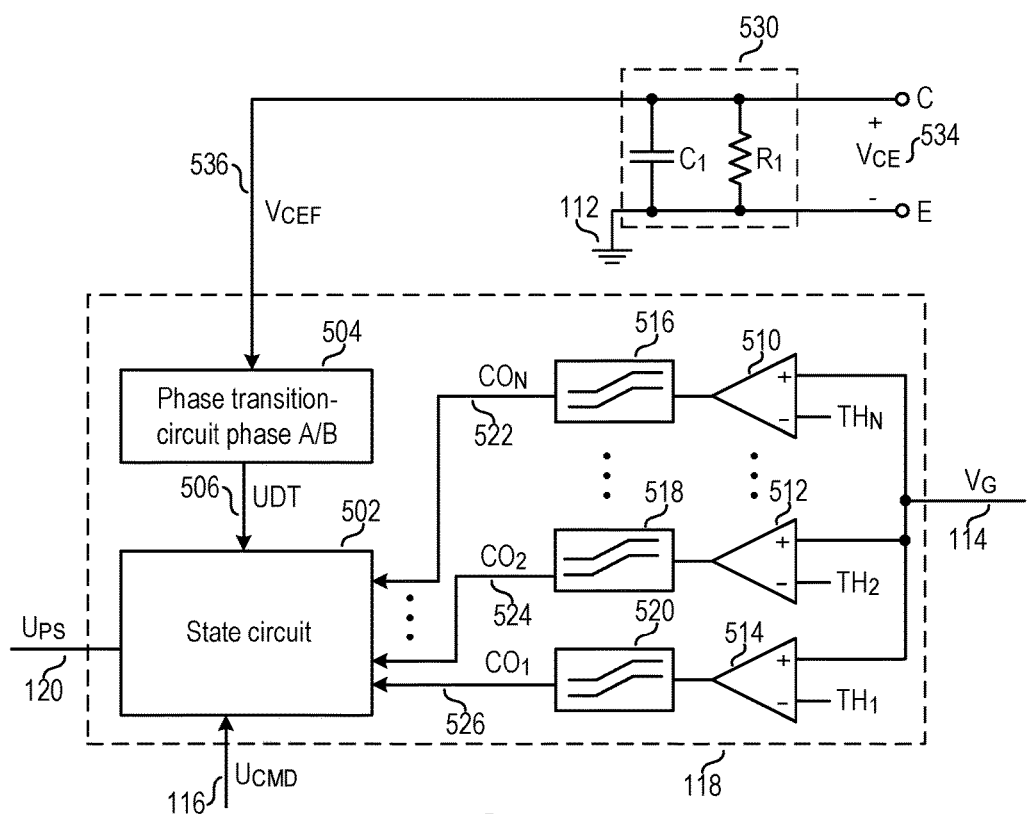
FIG. 5 shows an exemplary phase detection circuit which uses a collector-emitter voltage of a power semiconductor switch for phase detection.

Firstly, a schematic construction of an exemplary control circuit is explained with reference to FIG. 1. Exemplary signal profiles in a circuit comprising an exemplary control circuit are then discussed in association with FIG. 2. Exemplary configurations and optional components of the control circuit are discussed hereinafter. FIG. 3 and FIG. 5 show such exemplary configurations.

Firstly, the functions of the elements of an exemplary control circuit 100 will be discussed with reference to FIG. 1. FIG. 1 shows an exemplary control circuit 100 for a power semiconductor switch 108. The control circuit 100 in FIG. 1 is configured to control a switch-on process of the power semiconductor switch 108 by supplying a variable current to the control input of the semiconductor switch 108. Only control of the switch-on process is discussed hereinafter. However, the control circuits disclosed herein can also be used for controlling the turn-off process of a power semiconductor switch (particularly control circuits which comprise a variable current source and a phase detection circuit). In general, a turn-off process leads a semiconductor switch from a switched-on state ("ON state") to a switched-off state (OFF state). In this case, a current flows in the turned-on state, while no current flows in the switched-off state.

Figure 1:
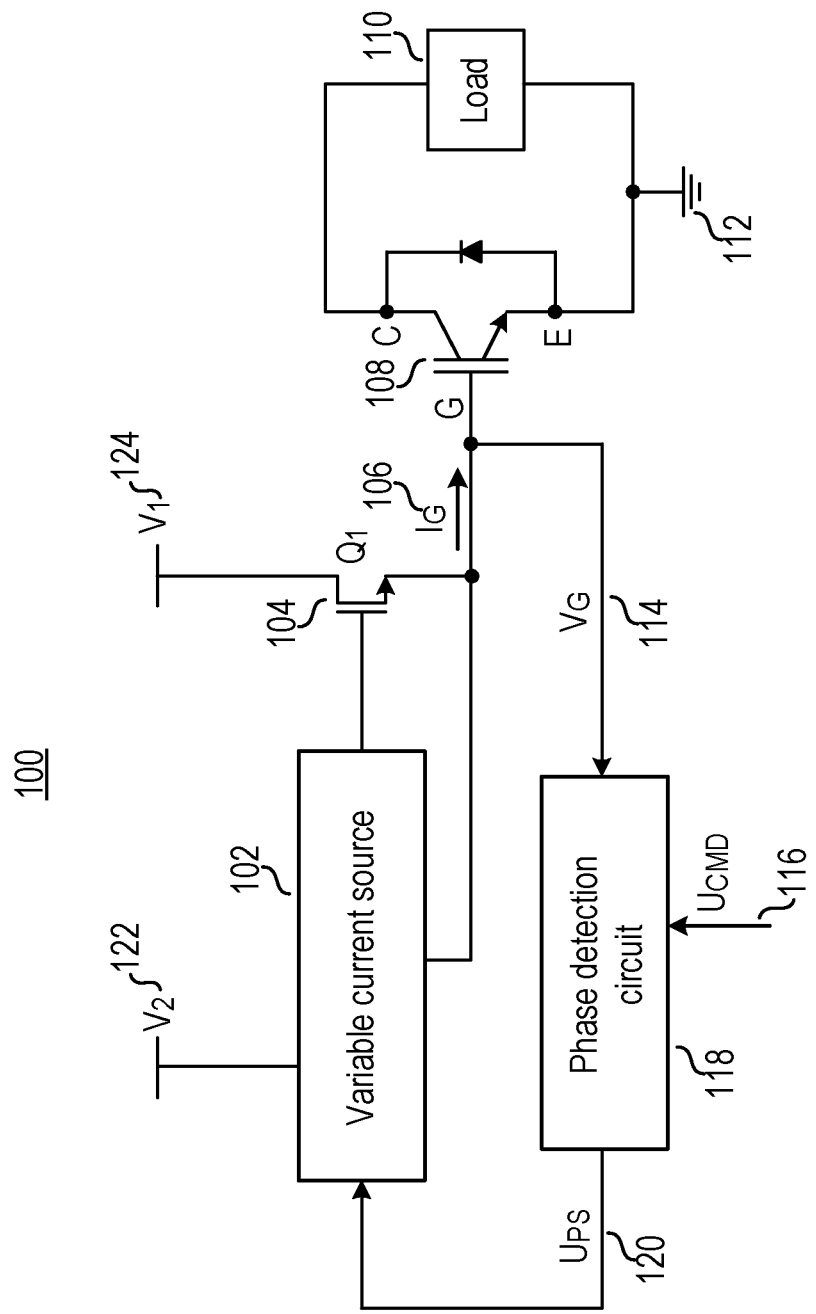
FIG. 1 shows an exemplary control circuit comprising a variable current source and a phase detection circuit.

As can be seen in FIG. 1, the power semiconductor switch 108 has a control input G, and two further inputs C, E, wherein the current through and/or the voltage between the further inputs C, E is controlled by a signal at the control input G.

The devices and methods are elucidated below on the basis of the example of IGBTs. However, the control circuits and control methods are not restricted to use with IGBTs. Rather, they can also be used in combination with other power semiconductor switches. For example, it is possible to use metal oxide semiconductor field effect transistors (MOSFETs), bipolar transistors, IEGTs ("injection enhancement gate transistors") and GTOs ("gate turn-off thyristors") with the control circuits. Moreover, the devices for detecting a profile of a voltage across a power semiconductor switch, the control circuits and the devices for providing electrical energy can be used with power semiconductor switches based on gallium nitride (GaN) semiconductors or silicon carbide (SiC) semiconductors.

A maximum nominal collector-emitter, anode-cathode or drain-source voltage of a power semiconductor switch in the switched-off state can be more than 500 V, preferably more than 2 kV.

Moreover, the control circuits are not restricted to power semiconductor switches. In this regard, it is also possible to use other semiconductor switches with the control circuits. The effects and advantages which are discussed here also occur at least in part in systems comprising other semiconductor switches.

Since IGBTs are discussed below, the terminals of the power semiconductor switch are designated as "collector", "gate" and "emitter". As already explained above, however, the devices and methods are not restricted to IGBTs. In order to avoid being unnecessarily drawn-out, the designation "emitter" herein also encompasses the terminal of corresponding power semiconductor switches which is designated by "source" or "cathode". Equally, the term "collector" herein also encompasses the terminal of corresponding power semiconductor switches which is designated by "drain" or "anode", and the term "gate" encompasses the terminal of corresponding power semiconductor switches which is designated by "base". The term "collector-emitter voltage" below also encompasses a "drain-source voltage" and a "cathode-anode voltage", and the terms "collector voltage" and "emitter voltage" also encompass a "drain voltage" or "anode voltage" and respectively a "source voltage" or "cathode voltage".

The control circuit in FIG. 1 comprises a variable current source 102, 104 and a phase detection circuit 118. The variable current source 102, 104 is configured to apply a variable current ($I_G$) 106 to the control input G of the power semiconductor switch 108 in response to a phase signal ($U_{PS}$) 120 in order to switch on the power semiconductor switch 108. In this case, the variable current ($I_G$) 106 can assume two or more (for example more than five) discrete values in the course of the switch-on process (an exemplary profile of the variable current is shown in the fourth curve from the top in FIG. 2). In other examples, the variable current source 102, 104 continuously varies the variable current ($I_G$) 106.

In the example in FIG. 1, the variable current source 102, 104 comprises a current source circuit 102 and a plurality of semiconductor switches ($Q_1$) 104. The power terminals of the plurality of semiconductor switches ($Q_1$) 104 are connected in parallel between a first reference voltage (V1) 124 and the control terminal G of the semiconductor switch 108. Consequently, the plurality of semiconductor switches (Q1) 104 can conduct a variable current into the control terminal G of the power semiconductor switch. By way of example, only a portion of the plurality of the semiconductor switches 104 can be in an ON state and thus conduct a predetermined current into the control terminal G. Alternatively or additionally, the semiconductor switches can be chosen to carry currents of different magnitudes (for example by means of a variable dimensioning of the semiconductor switches). In the example in FIG. 1, the plurality of semiconductor switches 104 are MOSFETs. Other semiconductor switches can be chosen in other examples.

Besides the plurality of semiconductor switches 104, the variable current source in FIG. 1 comprises the current source circuit 102. Said current source circuit 102 is configured to receive the phase signal ($U_{PS}$) 120 and, in response to this signal, to switch the plurality of semiconductor switches 104 such that a current having a specific level is supplied to the control terminal G depending on the respective phase of the switch-on process of the power semiconductor switch. An exemplary variable current source 102, 104 will be discussed further below in association with FIG. 3.

The phase signal ($U_{PS}$) 120 is generated by the phase detection circuit 118. In the example in FIG. 1, the phase detection circuit 118 receives the control voltage ($V_G$) 114 present at the control input G of the power semiconductor switch 108. On the basis of the profile of said voltage, the phase detection circuit 118 can determine which phase of the switch-on process the power semiconductor switch is in and generate a corresponding phase signal ($U_{PS}$) 120. The use of the control voltage ($V_G$) 114 (that is to say the gate-emitter voltage in the case of an IGBT) for detecting the phase of the switch-on process can afford advantages in some circuits. Firstly, the control voltage contains information regarding the phase of the switch-on process. In addition, control voltage can be detected more easily than other signals in the control circuit. In this regard, for example, a high voltage (for example the collector-emitter voltage) would first have to be brought to a lower voltage level, under certain circumstances. That may be associated with a certain outlay in terms of circuitry. The same applies to an operating current (for example a collector-emitter current) of the power semiconductor switch. Nevertheless, in other examples, it is also possible to use a voltage across the high-voltage inputs (for example the collector-emitter voltage) or an operating current (for example a collector-emitter current) as detection signal for the phase detection. These signals also contain the required information regarding the phases of the switch-on process.

The phase detection circuit 118 can furthermore comprise an input which can receive a control signal ($U_{CMD}$) 116 for the power semiconductor switch. Said control signal ($U_{CMD}$) 116 can have for example a first level if the power semiconductor switch is intended to be turned on, and a second level if the power semiconductor switch is intended to be switched off. Consequently, an edge in the control signal ($U_{CMD}$) 116 can signal that the power semiconductor switch is intended to be switched. The phase detection circuit 118 can detect, on the basis of the control signal ($U_{CMD}$) 116, when a switch-on process of the power semiconductor switch begins. This instant may simultaneously be the beginning of a first phase of the switch-on process (where the variable current source supplies a current having a first level to the control input G).

The control circuit in FIG. 1 forms a closed control loop for controlling the switch-on process of the power semiconductor switch 108. The controlled variable is the current supplied to the control input G. The measurement variable is the voltage at the control input ($V_G$) in the case of FIG. 1. A present phase of the switch-on process is determined from said control voltage. Depending on the phase which the power semiconductor switch is currently in, the control circuit in turn chooses a fixed or variable current. This respective current is supplied to the control input of the power semiconductor switch (which "closes" the control loop). Many control circuits in the prior art use control without feedback (i.e. an open control loop). The control circuit in FIG. 1 can achieve better results in comparison with those circuits, since a present state of the power semiconductor switch can influence the switch-on process. Moreover, the control in FIG. 1 can manage without external control terminal resistors.

Now that an exemplary control circuit has been presented in association with FIG. 1, an explanation will be given below, with reference to the curves in FIG. 2, concerning those phases of the switch-on process of the power semiconductor switch which the control circuit detects (and varies the current to the control input of the power semiconductor switch in response to the detection).

Figure 2:
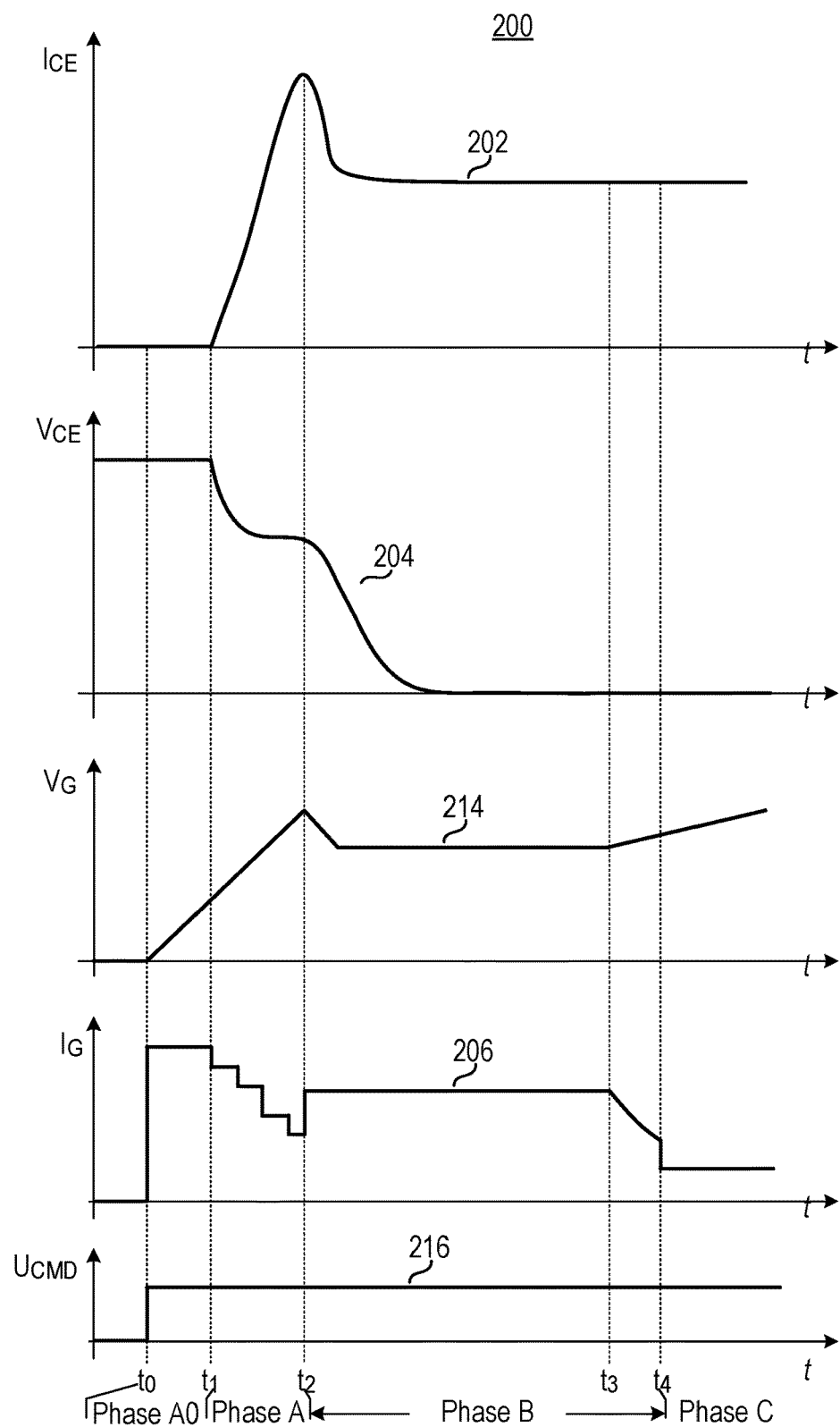
FIG. 2 shows exemplary signal profiles in an IGBT driver comprising a control circuit comprising a variable current source and a phase detection circuit.
Figure 3:
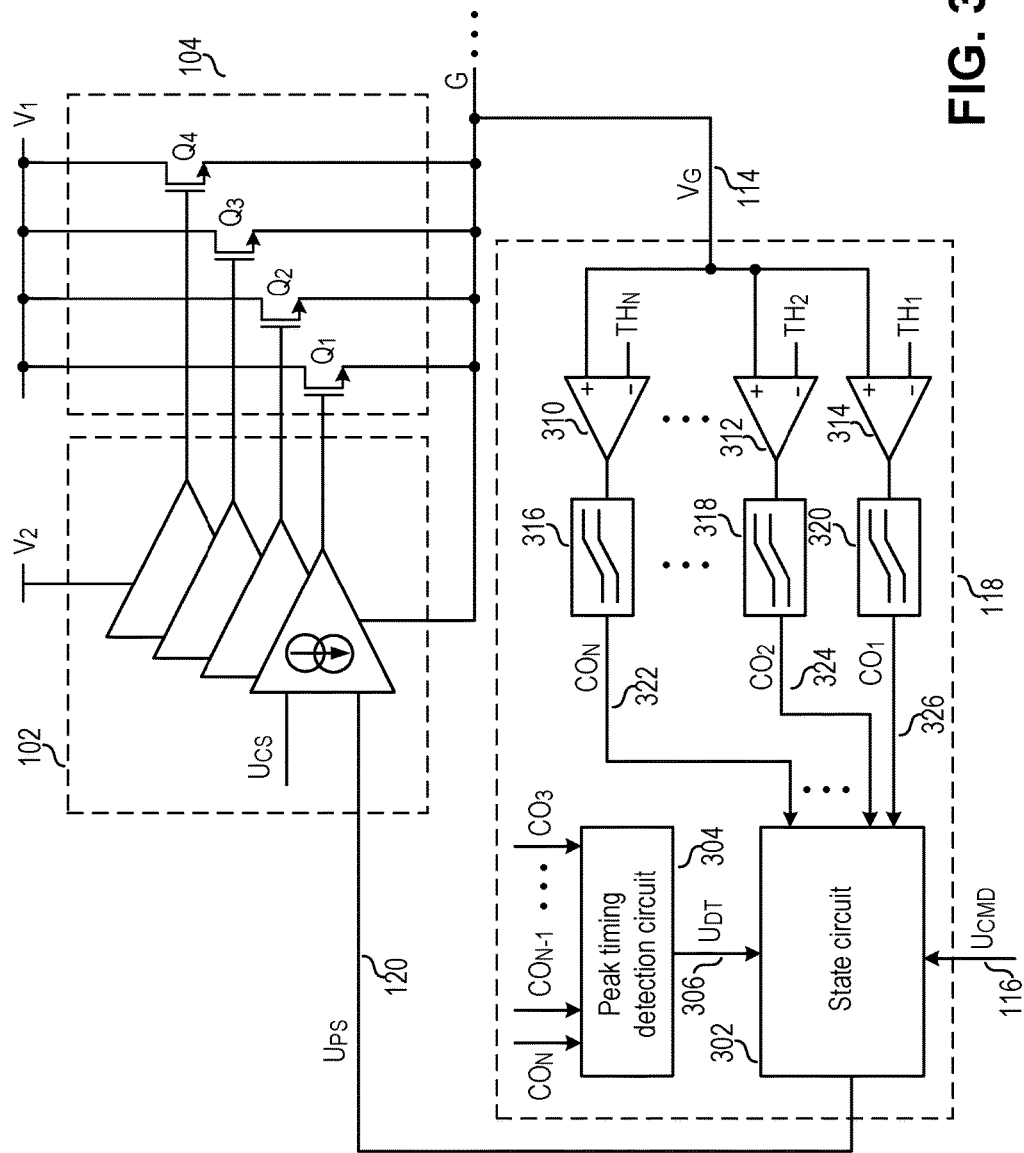
FIG. 3 shows an exemplary variable current source and a phase detection circuit.

FIG. 2 shows five idealized and exemplary curves. The topmost curve 202 shows a collector-emitter current ($I_{CE}$) of a power semiconductor switch, and the second curve 204 shows a collector-emitter voltage ($V_{CE}$) 204. The profile of a gate voltage ($V_G$) (i.e. the voltage at the control terminal of the IGBT) is plotted schematically in the third curve 214. The fourth curve 206 illustrates an exemplary profile of a current ($I_G$) which is fed from the variable current source into the control input of the power semiconductor switch. Finally, in the bottommost curve 216 there is an exemplary control signal ($U_{CMD}$) for the switching of the power semiconductor switch.

As plotted in FIG. 2, the switch-on process of the power semiconductor switch can be divided into different phases (A0, A, B and C). The power semiconductor switch is in a phase in each case for a specific time duration. The power semiconductor switch has a specific state in each of said phases. The length and manifestation of the phases depend, inter alia, on the parameters of the power semiconductor switch, the parameters of the control circuit and the load and also the operating parameters. As already described above, the control circuits described herein are configured to identify a present phase of the switch-on process and to adapt the variable control current on the basis of this identification.

The curves shown in FIG. 2 illustrate the switch-on behavior of an IGBT. However, other semiconductor switches also exhibit an at least partly similar switch-on behavior. In this regard, different phases can also be identified in the switch-on behavior of a power MOSFET or of a power bipolar transistor. Consequently, the control circuits described herein can also be used for other power semiconductor switches.

Furthermore, it is not mandatory for the control circuit to detect the four phases A0, A, B, C shown in FIG. 2 and to vary the current in response to the detection. Rather, in some examples, it is also possible to detect only a selection (for example two or three) of the phases shown in FIG. 2. In further examples, the division of the phases can deviate from the division shown in FIG. 2. In this regard, in some control circuits, a transition between a first and a second phase can occur at a different point than that shown in FIG. 2. In this example, too, however, a control circuit described herein can vary a current, induced into the control input of the power semiconductor switch, in response to the respectively present phase of the switch-on process.

The exemplary profile of the control signals of a control circuit as shown in FIG. 2 will now be discussed, which control circuit varies the current to the control input ($I_G$) in a closed control loop on the basis of the detected phases of the switch-on process of a power semiconductor switch, in order to switch on the power semiconductor switch.

The switch-on process begins at the instant t0 with a state change of the control signal $U_{CMD}$ (from a low to a high voltage level in the example in FIG. 2). A control unit of the power semiconductor switch thereby signals that said power semiconductor switch is to be switched on. The phase detection circuit can detect this state change in the control signal ($U_{CMD}$). A first phase A0 of the switch-on process begins with the state change. In the example in FIG. 2, in the phase A0 a constant current ($I_G$) is introduced into the control input of the power semiconductor switch (as can be seen in curve 206).

In the first phase, the power semiconductor switch does not yet conduct (the collector-emitter current ($I_{CE}$) is approximately zero). Therefore, the collector-emitter voltage ($V_{CE}$) remains at its (high) level which it has during the switched-off state of the power semiconductor switch. The profile of the control input voltage ($V_G$) (gate-emitter voltage) is determined by a charging process of different capacitances in the power semiconductor switch. By way of example, in the case of an IGBT, different capacitances can occur between gate and source of the MOSFET control head (for example an oxide capacitance, a capacitance of the depletion zone, a capacitance between a gate electrode and the emitter electrode, and so on). These capacitances are charged by the current applied to the control input in the phase A0. The voltage at the control input of the power semiconductor switch subsequently rises with a time constant determined by the internal capacitances of the power semiconductor switch.

A second phase of the switch-on process of the power semiconductor switch begins at the instant t1 at which the IGBT begins to conduct. That occurs if the control voltage VG reaches a threshold voltage of the MOSFET of the IGBT. The collector-emitter current ($I_{CE}$) then rises greatly (in this phase, a high collector-emitter voltage ($V_{CE}$) is present at the IGBT; therefore, the rise in the collector-emitter current ($I_{CE}$) is determined by the current gradient in the saturation region of the IGBT). The collector-emitter voltage ($V_{CE}$) does not yet decrease greatly (e.g. since a freewheeling diode of the IGBT cannot yet take up voltage). The control input voltage ($V_G$) furthermore increases at a rate determined by the capacitances of the IGBT.

The phase detection circuit can detect the beginning of the second phase A on the basis of the control input voltage ($V_G$). For example, the phase detection circuit can be configured to detect the beginning of the second phase A if the control input voltage ($V_G$) exceeds a predetermined threshold value. Some examples in this respect are presented further below. As already mentioned, the phase detection can also take place on the basis of other signals. In this regard, as can be seen in FIG. 2, the characteristic of the collector-emitter voltage ($V_{CE}$) and of the collector-emitter current ($I_{CE}$) changes at the instant t1. Consequently, in other examples, a phase detection circuit can identify the beginning of the second phase A on the basis of the collector-emitter voltage ($V_{CE}$) or the collector-emitter current ($I_{CE}$).

In response to a detection of the beginning of the second phase A, the variable current source of the control circuit varies a level of the current which is conducted into the control input of the power semiconductor switch. In the example in FIG. 2, the current which is conducted into the control input of the power semiconductor switch is reduced from its value in the first phase A0 in stages (for example in three or four stages). The length of the individual stages can be predetermined and adapted to the respective power semiconductor switch. For this purpose, the control circuit can define a predetermined set of delays that can be chosen by the user. Alternatively, a length of the individual phases can be set in response to the reaching of threshold voltages by the control input voltage ($V_G$). In some examples, a current level in a last subphase of the second phase A is chosen to correspond to a nominal energy of the power semiconductor switch. In FIG. 2, the current which is conducted into the control input of the power semiconductor switch is reduced in stages. In one example, the length of the stages can be chosen such that a transition to the last subphase of the second phase A takes place during normal operation if the load current through the power semiconductor switch reaches a level corresponding to a level of the load current during the Miller plateau of the switch-on process. In other examples, the current can also be reduced continuously.

The reduction in stages—as shown in FIG. 2—of the current which is conducted into the control input of the power semiconductor switch can bring about an increase in the current gradient of the collector-emitter current ($I_{CE}$) of the power semiconductor switch. As a consequence thereof, a maximum value of the collector-emitter current ($I_{CE}$) is reached earlier than in circuits which do not use the reduction of the control input current in stages. That can have the effect of reducing an energy loss during the switch-on process.

A third phase B of the switch-on process begins if the collector-emitter current ($I_{CE}$) of the power semiconductor switch reaches its maximum value (at the instant t2 in FIG. 2). Afterward, the freewheeling diode of the IGBT takes up voltage, the collector-emitter voltage ($V_{CE}$) decreases accordingly and the collector-emitter current ($I_{CE}$) falls to a constant load current value. As can be discerned in FIG. 2, the beginning of the third phase can also be detected on the basis of the collector-emitter voltage ($V_{CE}$) or the collector-emitter current ($I_{CE}$).

The phase detection circuit of the control circuit can detect the beginning of the third phase in response to the control input voltage ($V_G$) reaching the peak. In response to the identification of the beginning of the third phase B, the control circuit again varies the level of the current ($I_G$) introduced into the control input. In one example, the control circuit increases the level of the current ($I_G$) to a value between the value from the last subphase of the second phase A and the value (or the smallest of the values) of the first phase A0. The current ($I_G$) that flows into the control input discharges an internal capacitance of the power semiconductor switch in the third phase B. Owing to the rapid fall in the collector-emitter voltage ($V_{CE}$) and owing to the increase in the internal capacitances of the power semiconductor switch, the control input voltage ($V_G$) has a substantially flat profile in this phase.

As shown in FIG. 2, the control circuit can also vary the current ($I_G$) introduced into the control input in different subphases in the third phase B. In this regard, in the example from FIG. 2, the current ($I_G$) firstly has a constant value before a rising control input voltage ($V_G$) is accompanied by a falling current ($I_G$) at the instant t3.

A fourth and last phase C of the switch-on process begins at the instant t4. The collector-emitter voltage ($V_{CE}$) has fallen to such a great extent that the IGBT reaches its active range. The collector-emitter current ($I_{CE}$) has reached its nominal value in the switched-on state. The control input voltage ($V_G$) strives towards its steady-state value. The beginning of the fourth phase C can be identified by the phase detection circuit if the control input voltage ($V_G$) exceeds a further (second) predetermined threshold value.

In response to the detection of the beginning of the fourth phase C, the control circuit can again vary a level of the current ($I_G$) which is conducted into the control input. In the example from FIG. 2, the control circuit sets the current ($I_G$) to a constant level. The latter is lower than the levels of the variable current ($I_G$) in all preceding phases A0, A, B. In one example, the current ($I_G$) is chosen such that it corresponds to a minimum current (if appropriate taking account of a predetermined safety margin) to keep the IGBT in operation. This choice can be advantageous with the use of some topologies of the variable current source, since these circuits consume power during the entire switched-on duration of the IGBT. A lowest possible level of the current ($I_G$) can thus reduce the power loss of the control circuit during the switched-on duration of the IGBT.

The last sections have explained how an exemplary control circuit varies a current supplied to the control input in the course of the switch-on process of a power semiconductor switch. As already mentioned, the control circuit can also detect only a portion of the four phases in FIG. 2 and correspondingly vary the current ($I_G$) (e.g. only the first, second and third phases A0, A, B, only the second, third and fourth phases A, B, C or only the second and fourth phases A, C).

In association with FIG. 2, the last sections have functionally described an exemplary control circuit. The next sections will discuss exemplary circuits for implementing the control circuit in association with FIGS. 3 to 5.

As already explained with reference to FIG. 1, the control circuit can comprise a variable current source and a phase detection circuit. An exemplary configuration of these two components can be seen in FIG. 3. The variable current source 102, 104 comprises a current source circuit 102 and a plurality of semiconductor switches ($Q_1$) 104. The phase detection circuit 118 comprises various components for detecting which phase of the switch-on process the power semiconductor switch is currently in. Both components (the variable current source 102, 104 and the phase detection circuit 118) will be explained in more precise detail below.

The variable current source 102, 104 will be discussed first. As can be seen in FIG. 3, the variable current source 102, 104 has a plurality of parallel current source stages in one example. Each of said stages comprises a current amplifier 102 and a semiconductor switch 104, which can supply a current to the control input G of the power semiconductor switch. The output currents of the parallel current source stages can be chosen such that different current levels required by the control circuit are available as a result of switching on and off. In this way, a variable current can be applied to the control input G of the power semiconductor switch during the switch-on process.

In one example, the current amplifiers 102 can be configured to receive a phase signal ($U_{PS}$) 120 and a reference current signal ($U_{CS}$). Hereinafter, it is assumed that the reference current signal ($U_{CS}$) is a reference current. In other examples it may be a reference voltage. The variable current source 102, 104 can activate one or a plurality of parallel current source stages in response to the phase signal ($U_{PS}$) 120. A predetermined current (depending on the output current of the one or more current source stages) is then conducted into the control input. The current source stages can supply different or identical output currents. Four parallel current source stages are depicted schematically in FIG. 3. However, the number of current source stages can be different in other examples (e.g. two (or more), three or more than four). The number and the output currents of the current source stages can be chosen such that a variable current source can provide the majority of output currents required (by activation of one or a plurality of current source stages).

In this case, the phase detection signal can contain information that the power semiconductor switch has entered one of the phases discussed above in association with FIG. 2 (phase A0, A, B or C). The variable current source 102, 104 can supply output currents having the properties (levels and time durations) such as were likewise explained in association with FIG. 2.

In order to provide the respective output currents, each of the parallel current source stages can amplify the reference current with a predetermined factor. In one example, the reference current is received from a region of the control circuit with a lower voltage level (for example 4 to 6 V). On the other hand, the semiconductor switches 104 of the variable current source 102, 104 are connected between the control input G of the power semiconductor switch and a reference voltage of a region of the control circuit having a higher voltage level V1 (for example 24 to 26 V). Consequently, the semiconductor switches 104 conduct the variable output current of the variable current source 102, 104 from the region of the control circuit having a higher voltage level V1 into the control input. In one example, the variable current source 102, 104 achieves the above-described conversion from the region having a low voltage level into the region having a higher voltage level without using level shifters.

In one example, each of the parallel current source stages contains a current mirror circuit which amplifies the reference current to the respective output current. In one example, each current mirror circuit can comprise a plurality of MOSFET semiconductor switches dimensioned to provide the respective output current. In addition, the semiconductor switches of one or more of the parallel current source stages can be arranged in a cascoded manner. That can improve an output resistance of the current source stages. Additionally or alternatively, the semiconductor switches in each of the parallel current source stages can be of different design. In this regard, in one example, it is possible to use semiconductor switches having a low nominal voltage and semiconductor switches having a higher nominal voltage.

The use of current mirror circuits for generating the output current in the variable current source can afford various advantages. Firstly, a transconductance of the circuit can be varied by injection of a desired current. Moreover, the variable transconductance can make it possible to realize a closed control loop when switching on the power semiconductor switch. Furthermore, process and temperature fluctuations can be (at least partly) compensated for in the current mirror circuits. Moreover, a response time of the variable current source can be reduced (for example in comparison with a circuit having an inverter chain).

As already mentioned, the variable current source 102, 104 can comprise a plurality of semiconductor switches. In one example, the semiconductor switches can be integrated with a separate source well (in the case of MOSFETs). That can reduce a variation of the output current with the temperature.

In other examples, active regions of the semiconductor switches (in the current source stages) can be chosen as integer multiples of a reference semiconductor switch. That can reduce a fluctuation of the output current as a result of a process-dictated variation during production.

It has already been explained in association with FIG. 2 that the variable current source can provide an output current having different levels within a phase (see, for example, the second phase A in FIG. 2). In one example, the two or more stages of the output current can be generated in response to output pulses of a pulse generating circuit. The latter can generate one or more pulses of predetermined length beginning at the instant at which the phase signal ($U_{PS}$) signals the beginning of a specific phase. The variable current source can generate a predetermined current starting from a state change of each of the pulses. Consequently, the pulse generating circuit can attain the time duration of the different subphases without using an oscillator or the like. A multi-stage configuration of the variable current was discussed only for the second phase A in FIG. 2. However, this technique (using a pulse generating circuit) can also be used in other phases of the switch-on process.

The preceding sections discussed some examples of the implementation of the variable current source 102, 104. The following sections will discuss various aspects regarding the implementation of the phase detection circuit 118, once again on the basis of the example in FIGS. 3 and 5. The phases of the switch-on process of the power semiconductor switch which the phase detection circuit can detect have already been discussed in association with FIG. 2.

The phase detection circuit 118 in FIG. 3 contains a state circuit 302, a peak timing detection circuit 304, a plurality of comparators 310, 312, 314 and a plurality of optional level shifters 316, 318, 320. By means of these components, the phase detection circuit can determine the phase of the switch-on process which the power semiconductor switch is currently in.

In FIG. 3, the phase detection circuit 118 receives the control input voltage ($V_G$) and the control signal ($U_{CMD}$). On the basis of these signals, the phase detection circuit 118 can determine which phase of the switch-on process is currently being run through. As already mentioned, instead of the control input voltage ($V_G$), it is also possible to use some other signal that characterizes the switch-on behavior of the power semiconductor switch (for example the collector-emitter voltage ($V_{CE}$) or the collector-emitter current ($V_{CE}$)). As explained further below in association with FIG. 5, in addition to the control input voltage ($V_G$), it is possible, moreover, to use one or a plurality of further other signals characterizing the switch-on behavior of the power semiconductor switch (for example the collector-emitter voltage ($V_{CE}$) or the collector-emitter current ($V_{CE}$)).

The phase detection circuit generates a phase detection signal ($U_{PS}$) 120 which indicates the respective phase (and/or a transition between two phases). In some examples, the phase signal ($U_{PS}$) 120 can include a plurality of channels each indicating the presence of one specific phase or the instant of a transition between two specific phases. As described further above, the phase signal ($U_{PS}$) 120 is received by the variable current source 102, 104, which outputs a corresponding current in response to the phase signal ($U_{PS}$) 120.

The phase detection circuit 118 is configured to detect two different characteristics of the control input voltage ($V_G$): firstly, the phase detection circuit 118 can detect when the control input voltage ($V_G$) exceeds (or falls below) one or a plurality of predetermined threshold values. Secondly, the phase detection circuit 118 can detect when the control input voltage ($V_G$) has a peak. It has already been explained in association with FIG. 2 that these two detection steps can suffice for identifying a plurality of phase transitions during the switch-on process of the semiconductor switch. Firstly, the plurality of comparators 310, 312, 314 will now be discussed, with the aid of which the phase detection circuit 118 can ascertain when the control input voltage ($V_G$) exceeds a specific threshold value. In the example from FIG. 3, the comparison circuit is configured in the manner of a flash ADC (i.e. the plurality of comparators 310, 312, 314 operate in parallel). The control input voltage ($V_G$) is compared respectively with a reference voltage TH1, TH2, THN in the parallel comparators 310, 312, 314. The phase detection circuit 118 can thus determine when a specific limit value TH1, TH2, THN is exceeded. In the example in FIG. 2, a comparison of the control input voltage ($V_G$) with a threshold value may be necessary for the identification of the phase transition from the first to the second phase (A0→A) and for the identification of a transition from the third to the fourth phase (B→C). These comparisons are carried out in each case by one of the plurality of parallel comparators 310, 312, 314.

In the example from FIG. 3, moreover, a plurality of the parallel comparators 310, 312, 314 are also used for the detection of a point in time at which the control input voltage ($V_G$) reaches the peak. These comparison values can therefore be used for detecting the transition from the second to the third phase (A→B) in accordance with FIG. 2. That is explained in further detail further below in association with the peak detection circuit 304.

In one example, the reference voltages TH1, TH2, THN can be generated with reference to the first reference voltage ($V_1$). For example, the first reference voltage ($V_1$) can be divided down by one or a plurality of voltage dividers (e.g. one voltage divider per comparator 310, 312, 314) to the desired reference voltages TH1, TH2, THN.

The comparison circuit in the manner of a flash ADC in FIG. 3 may be advantageous if the control input voltage ($V_G$) is used for detecting the phases of the input signal, since the comparison circuit in the manner of a flash ADC in FIG. 3 can have a high input impedance. The control input G can have a high output resistance, which makes it more difficult to use a detection circuit having a low input resistance (since otherwise charge could flow away from the control input, which could disturb the signal to be measured).

In one example, one or a plurality of the comparators 310, 312, 314 are configured as folded transconductance amplifier with push-pull output stage. In a further example, one or a plurality of the comparators 310, 312, 314 are configured as latched circuit with push-pull output stage. Both alternatives can have a large common-mode range, which may be necessary for detecting a point in time at which the control input voltage ($V_G$) reaches the peak (the voltage at the peak of the control input voltage ($V_G$) can be, for example, 96% of the first reference voltage $V_1$). The solution with a latched circuit with push-pull output stage can in this case have a smaller structural size of the output stage and a higher rate of rise in comparison with the solution with a transconductance amplifier with push-pull output stage.

Since the state circuit 302 is arranged in a region having a lower voltage in the example from FIG. 3, the output signals of the comparators 310, 312, 314 are reduced by corresponding level shifters 316, 318, 320. The resulting signals CO1, CO2, CON can be received and processed further by the state circuit 302 and the peak detection circuit 304.

The following sections will now discuss an exemplary peak timing detection circuit 304 in greater detail.

In one example, the peak timing detection circuit 304 can receive the output signals $CO_N$, $CO_{N-1}$ ... $CO_3$ from a plurality of the comparators 310, 312, 314 as input signal. The peak timing detection circuit 304 can be configured to identify a peak in the control input voltage ($V_G$) if the control input voltage ($V_G$) has exceeded all threshold voltages of a subset of the comparators 310, 312, 314 (for example one or two comparators) which supply the output signals $CO_N$, $CO_{N-1}$ ... $CO_3$ and has again fallen below the threshold voltage of the comparator of the subset having the highest threshold voltage. In this case, the peak timing detection circuit 304 signals to the state circuit 302 by means of a detection signal ($U_{DT}$) 306 that the control input voltage ($V_G$) has reached a peak. In this example, the peak detection is carried out independently of a magnitude of the voltage maximum of the control input voltage ($V_G$).

In some cases, the control input voltage ($V_G$) does not have a pronounced peak. Moreover, the peak timing detection circuit presented above may be disturbed by oscillations during the transition from the second phase A to the third phase B. Therefore, a peak timing detection circuit 304 (in addition or as an alternative to the peak timing detection circuit discussed above) can comprise a further circuit. An exemplary further circuit is discussed below.

The further exemplary peak timing detection circuit also has the output signals of a subset of the comparators 310, 312, 314 as input signals. In addition, a further signal delayed by a predetermined delay is generated for each of the subset of the comparators 310, 312, 314. The delayed and the undelayed output signals of each comparator 310, 312, 314 are applied to an OR gate. In each case the earliest occurring signal for each threshold voltage is thus determined. The instant of the peak is determined by an ANDing of the output signals of the OR gate. In this case, it is possible to select the individual delays for the respective type of power semiconductor switch (e.g. taking account of a gradient of a rise in the control input voltage ($V_G$) after the beginning of a switch-on process).

The preceding sections explained how the phase detection circuit can detect various features of the control input voltage ($V_G$). The following sections will explain how the phase which the switch-on process is currently running through can be detected from the output signals of the comparators 310, 312, 314, the control signal ($U_{CMD}$) 116 and the output signal of the peak timing detection circuit 304.

Figure 4:
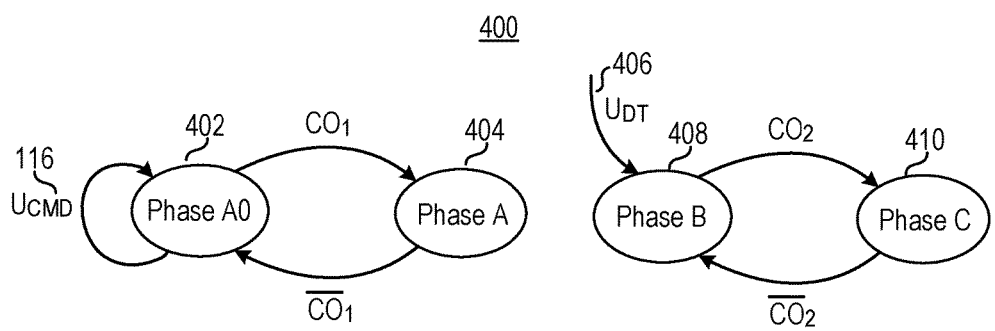
FIG. 4 shows a state diagram of an exemplary control circuit.

This function is performed by the state circuit 302, the function of which is explained in association with FIG. 4. As can be seen in FIG. 4, the state circuit 302 can comprise a state machine. In the example in FIG. 4, the state circuit 302 can identify which of four phases of the switch-on process the power semiconductor switch is currently in. The four phases correspond to the four phases which were discussed in association with FIG. 2 (i.e. phases A0, A, B and C).

As already mentioned, a beginning of the switch-on process can be detected on the basis of the control signal ($U_{CMD}$) 116 for the semiconductor switch. In one example, the beginning of a switch-on process of the power semiconductor switch can be detected if the control signal ($U_{CMD}$) 116 has a rising or falling edge. In response to the state change of the control signal ($U_{CMD}$) 116, the state circuit 302 can identify that the power semiconductor switch has entered the phase 402 (A0) of the switch-on process.

Furthermore, the state circuit 302 can decide, on the basis of an output signal ($CO_1$) of a first comparator, whether a transition from the first phase 402 (A0) to the second phase 404 (A) has taken place. If the control input voltage ($V_G$) exceeds the threshold voltage of the first comparator, the output signal $CO_1$ of the first comparator has a first state (e.g. a high level $CO_1$). If the control input voltage ($V_G$) falls below the threshold voltage of the first comparator, the output signal $CO_1$ of the first comparator has a second state (e.g. a low level $\overline{CO_1}$). In some examples, the comparator must maintain a specific state for a predetermined time duration before a phase change is detected.

In some examples, the respective comparator (for example the first comparator for the transition from phase A0 to phase A) can be turned off a predetermined time after the phase transition has been ascertained (e.g. 20 ns to 80 ns). A power consumption of the circuit can be reduced as a result.

As already discussed, a transition to a third phase (B) 408 can be identified on the basis of an output signal 406 (corresponding to the detection signal ($U_{DT}$) 306) of a peak timing detection circuit. If said output signal 406 signals that the control input voltage ($V_G$) has reached a peak (or a maximum), the state circuit 302 changes the present phase to the second phase (B) 406. As already mentioned, the output signal 406 of the peak detection circuit can determine a point in time of the peak of the control input voltage ($V_G$) on the basis of the output signal of a plurality of comparators. The latter can also be turned off at a predetermined time duration (e.g. 20 ns to 80 ns) after the identification of the phase transition from the second to the third phase (A→B).

The transition from phase B 408 (the third phase) to the phase C 410 (the fourth phase) can take place in reaction to the output signal CO2 of a second comparator. The state circuit 302 can thus identify whether a transition from the third phase (B) 408 to a fourth phase (C) 410 has taken place. If the control input voltage ($V_G$) exceeds the threshold voltage of the second comparator, the output signal $CO_2$ of the second comparator has a first state (e.g. a high level $CO_2$). If the control input voltage ($V_G$) falls below the threshold voltage of the second comparator, the output signal CO2 of the second comparator has a second state (e.g. a low level $\overline{CO_2}$).

The entry into the fourth phase (C) 410 is the last phase transition identified by the state circuit 302. In other examples, the switch-on process can be divided into more phases (e.g. five, six or seven or more phases) which can be detected on the basis of the profile of the control input voltage ($V_G$). In still other examples, the switch-on process can be divided into fewer phases (e.g. two or three) which can be detected on the basis of the profile of the control input voltage ($V_G$). In all cases, it is possible to use phase detection circuits and variable current sources of the kind as discussed further above for the case of four phases of the switch-on process.

As soon as the entry into a specific phase has been identified, the state circuit 302 generates a corresponding phase signal ($U_{PS}$) 120. This phase signal ($U_{PS}$) 120 can then be received by a variable current source, as discussed above. The variable current source can in turn conduct an output current (constant or variable) predetermined for the respective phase to the control input of the power semiconductor switch, in order to switch on the power semiconductor switch.

The preceding sections discussed exemplary variable current sources and phase detection circuits of the control circuit with reference to FIG. 3 and FIG. 4. Another variant of these circuits will be discussed below.

FIG. 5 shows an alternative to the peak timing detection circuit in FIG. 3, for identifying the transition from the second phase to the third phase (A→B) (i.e. an instant at which a collector-emitter current ($I_{CE}$) has a maximum value). The phase circuit 118 in FIG. 5 contains a phase transition circuit 504, which receives a signal ($V_{CEF}$) 536 based on the collector-emitter voltage ($V_{CE}$) as input signal and detects a phase transition on the basis of this signal.

The signal ($V_{CEF}$) 536 based on the collector-emitter voltage ($V_{CE}$) is generated by a filter 530 containing a capacitance C1 and a resistive element R1, which are coupled between a collector terminal C and an emitter terminal E of the power semiconductor switch.

In one example, a control circuit of an IGBT can comprise a series circuit of parallel-connected capacitances and resistive elements, which is coupled to the collector terminal of the power semiconductor switch (for example in order to provide an active clamping function). The filter 530 can be coupled between a last capacitance of the series circuit of parallel-connected capacitances and resistive elements and a reference voltage level 112.

The filter 530 can be configured to generate a voltage spike if the peak of the collector-emitter current has been exceeded. This signal ($V_{CEF}$) 536 is forwarded to the phase transition circuit 504. In the phase transition circuit 504, in one example, an instant of the peak of the collector-emitter current ($I_{CE}$) can be determined from the signal ($V_{CEF}$) 536. This information can be used by the phase transition circuit 504 to detect a phase transition from the second phase (A) to the third phase (B) of the switch-on process. A corresponding detection signal ($U_{DT}$) 506 can in turn be communicated to the state detection circuit 502.

In one example, the phase transition circuit 504 can amplify the signal ($V_{CEF}$) 536 and apply the amplified signal to a differential amplifier. The resulting signal can have a falling edge at the instant of the peak of the collector-emitter current ($I_{CE}$) and thus indicate the phase transition from the second to the third phase (A→B). By way of example, the falling edge of the resulting signal can be detected for this purpose.

In one example, the phase transition circuit 504 can amplify the signal ($V_{CEF}$) 536 in three amplifier stages. Firstly, a buffer amplifier can reduce the output impedance of the signal to be detected at the $V_{CE}$ node. Afterwards a non-inverting amplification followed by a differential amplification of the signal can be carried out.

The above description of the illustrated examples of the present invention is not meant to be exhaustive or restricted to the examples. While specific embodiments and examples of the invention are described herein for illustration purposes, various modifications are possible, without departing from the present invention. The specific examples of voltage, current, frequency, power, values of ranges, times, etc. are merely illustrative, and so the present invention can also be implemented with other values for these variables.

These modifications can be carried out on examples of the invention in light of the detailed description above. The terms used in the following claims should not be interpreted such that the invention is restricted to the specific embodiments disclosed in the description and the claims. The present description and the figures should be regarded as illustrative and not as restrictive.

What is claimed is:

1. A control circuit for turning on a power semiconductor switch, comprising:
   an input coupled to receive a first signal that characterizes a switch-on behavior of the power semiconductor switch;
   a phase detection circuit coupled to detect two or more phases of the switch-on behavior of the power semiconductor switch in response to the first signal, wherein the phase detection circuit is coupled to generate a phase signal that indicates which of the two or more phases the power semiconductor switch is currently running through, and wherein the phase detection circuit is coupled to detect a peak indicative of a phase transition between the two or more phases; and
   a variable current source coupled to supply a current with a variable level to a control input of the power semiconductor switch to switch on the power semiconductor switch, wherein the control circuit is coupled to control the variable current source in a closed control loop in response to the first signal.

2. The control circuit of claim 1, wherein the first signal is a control input voltage.

3. The control circuit of claim 2, wherein the control input voltage is a base-emitter voltage.

4. The control circuit of claim 2, wherein the control input voltage is a gate-source voltage.

5. The control circuit of claim 1, wherein the phase detection circuit is coupled to detect transitions between the two or more phases of the switch-on behavior of the power semiconductor switch in response to the first signal exceeding a respective reference signal.

6. The control circuit of claim 5, wherein the phase detection circuit comprises one or a plurality of level shifters coupled to convert an internal signal that is output by one or a plurality of comparators from a high voltage level in the control circuit to a low voltage level in the control circuit.

7. The control circuit of claim 1, wherein the peak is a peak in the first signal, and wherein the phase detection circuit comprises a peak timing detection circuit coupled to detect the peak identifying a point in time of the peak in the signal.

8. The control circuit of claim 1, wherein the phase detection circuit is coupled to detect at least four phases of the switch-on behavior of the power semiconductor switch.

9. The control circuit of claim 8, wherein a first phase begins if a switch-on signal of the control circuit of the power semiconductor switch indicates that the power semiconductor switch is intended to be switched on, and wherein the first phase ends if the first signal exceeds a first threshold value.

10. The control circuit of claim 9, wherein a second phase begins if the first signal exceeds the first threshold value, and wherein the second phase ends if the first signal reaches the peak.

11. The control circuit of claim 10, wherein a third phase begins if the first signal reaches the peak, and wherein the third phase ends if the first signal exceeds a second threshold value, wherein the second threshold value is higher than the first threshold value.

12. The control circuit of claim 11, wherein a fourth phase begins if the first signal exceeds the second threshold value.

13. The control circuit of claim 1, wherein the variable current source comprises a plurality of parallel driver stages.

14. The control circuit of claim 13, wherein the control circuit further comprises a selection circuit coupled to select one or a plurality of driver stages that supply a predetermined input current in response to a phase detection signal.

15. The control circuit of claim 1, wherein the phase detection circuit is coupled to detect the peak by identifying an instant at which a collector-emitter current of the power semiconductor switch has a maximum value.

16. The control circuit of claim 15, wherein the phase detection circuit comprises a filter coupled between a collector terminal and an emitter terminal of the power semiconductor switch, the filter configured to generate a voltage spike indicative of the peak.

17. A control circuit for a power semiconductor switch, comprising:
a phase detection circuit coupled to receive a control input voltage that characterizes a switch-on behavior of the power semiconductor switch, wherein the phase detection circuit is coupled to generate a phase detection signal that indicates which of two or more phases the power semiconductor switch is running through; and
a variable current source coupled to receive the phase detection signal, wherein the variable current source is coupled to supply a plurality of discrete levels of current strengths to a control input of the semiconductor switch in response to the phase detection signal,
wherein the variable current source is coupled to supply a current having a first one of the plurality of discrete levels of current strengths to the control input of the power semiconductor switch in a first phase of a switch-on process of the power semiconductor switch, wherein the variable current source is coupled to supply a current having two or more of the plurality of discrete levels of current strengths to the control input of the power semiconductor switch in a second phase of a switch-on process of the power semiconductor switch, wherein the first one of the plurality of discrete levels of current strengths supplied to the control input of the power semiconductor switch in the first phase is greater than a last one of the two or more of the plurality of discrete levels of current strengths supplied to the control input of the power semiconductor switch in the second phase, wherein the first phase comes before the second phase.

18. The control circuit of claim 17, wherein the variable current source is coupled to supply a current having a third one of the plurality of discrete levels of current strengths to the control input of the power semiconductor switch in a third phase of the switch-on process of the power semiconductor switch, wherein the third one of the plurality of discreet levels of current strengths to the control input of the power semiconductor switch in the third phase is lower than the first one of the plurality of discrete levels of current strengths supplied to the control input of the power semiconductor switch in the first phase and higher than the last one of the two or more of the plurality of discrete levels of current strengths supplied to the control input of the power semiconductor switch in the second phase, wherein the first phase comes before the second phase, and wherein the second phase comes before the third phase.

19. The control circuit of claim 18, wherein the variable current source is coupled to supply a current having a fourth one of the plurality of discrete levels of current strengths to the control input of the power semiconductor switch in a fourth phase of the switch-on process of the power semiconductor switch, wherein the fourth one of the plurality of discreet levels of current strengths to the control input of the power semiconductor switch in the fourth phase is lower than the current strengths supplied to the control input of the power semiconductor switch in the first, second, and third phases, and wherein the third phase comes before the fourth phase.

20. The control circuit of claim 17, wherein the phase detection circuit is coupled to detect when the switch-on process of the power semiconductor begins in response to a control signal.

21. The control circuit of claim 17, wherein the phase detection circuit is coupled to detect a beginning of the second phase in response to the control input voltage exceeding a threshold value.

22. The control circuit of claim 17, wherein the variable current source comprises a plurality of parallel driver stages.

23. The control circuit of claim 22, wherein the plurality of parallel driver stages are coupled to receive the phase detection signal and a reference current signal, wherein one or more of the plurality of parallel driver stages is coupled to be activated in response the phase detection signal.

24. The control circuit of claim 23, wherein each one of the plurality of parallel driver stages comprises:
a current amplifier coupled to receive the phase detection signal and the reference current signal; and
a semiconductor switch having a control input coupled to an output of the current amplifier, wherein an output of the semiconductor switch is coupled to the control input of the power semiconductor switch.

25. The control circuit of claim 17, wherein the phase detection circuit comprises:
a plurality of comparators, wherein each one of the plurality of comparators is coupled to receive the control input voltage that characterizes the switch-on behavior of the power semiconductor switch, wherein each one of the plurality of comparators is further coupled to compare the control input voltage with a respective reference voltage;
a peak timing detection circuit coupled to output a detection signal to indicate that the control input voltage has reached the peak in response to outputs of the plurality of comparators; and
a state circuit coupled to output the phase detection signal in response to a control signal, the detection signal, and the outputs of the plurality of comparators, wherein the control signal has a first level if the power semiconductor switch is intended to be turned on, and wherein the control signal has a second level if the power semiconductor switch is intended to be turned off.

26. The control circuit of claim 25, wherein the phase detection circuit further comprises a plurality of level shifters coupled to the outputs of the plurality of comparators, and wherein the state circuit and the peak timing detection circuit are coupled to outputs of the plurality of level shifters.

27. A control circuit for turning on a power semiconductor switch, comprising:
   an input coupled to receive a first signal that characterizes a switch-on behavior of the power semiconductor switch;
   a phase detection circuit coupled to detect two or more phases of the switch-on behavior of the power semiconductor switch in response to the first signal, wherein the phase detection circuit is coupled to generate a phase signal that indicates which of the two or more phases the power semiconductor switch is currently running through, and wherein the phase detection circuit comprises a peak timing detection circuit coupled to identify a point in time of a peak in the first signal; and
   a variable current source coupled to supply a current with a variable level to a control input of the power semiconductor switch to switch on the power semiconductor switch, wherein the control circuit is coupled to control the variable current source in a closed control loop in response to the first signal.

28. A control circuit for turning on a power semiconductor switch, comprising:
   an input coupled to receive a first signal that characterizes a switch-on behavior of the power semiconductor switch;
   a phase detection circuit coupled to detect at least four phases of the switch-on behavior of the power semiconductor switch in response to the first signal, wherein the phase detection circuit is coupled to generate a phase signal that indicates which of the at least four phases the power semiconductor switch is currently running through; and
   a variable current source coupled to supply a current with a variable level to a control input of the power semiconductor switch to switch on the power semiconductor switch, wherein the control circuit is coupled to control the variable current source in a closed control loop in response to the first signal;
   wherein a first phase begins if a switch-on signal of the control circuit of the power semiconductor switch indicates that the power semiconductor switch is intended to be switched on and ends if the first signal exceeds a first threshold value;
   wherein a second phase begins if the first signal exceeds the first threshold value and ends if the first signal reaches a peak;
   wherein a third phase begins if the first signal reaches the peak and ends if the first signal exceeds a second threshold value, the second threshold value higher than the first threshold value; and
   wherein a fourth phase begins if the first signal exceeds the second threshold value.

* * * * *

UNITED STATES PATENT AND TRADEMARK OFFICE
CERTIFICATE OF CORRECTION

Page 1 of 1

PATENT NO. : 10,038,439 B2
APPLICATION NO. : 15/698292
DATED : July 31, 2018
INVENTOR(S) : Siebler It is certified that error appears in the above-identified patent and that said Letters Patent is hereby corrected as shown below:

In the Specification

| Column | Line | Error |
|---|---|---|
| 18 | 66-67 | "peak in the signal" should read |
| (Claim 7, Lines 4-5) | | --peak in the first signal-- |

Signed and Sealed this
Second Day of October, 2018

Andrei Iancu
*Director of the United States Patent and Trademark Office*